(12) United States Patent
Berg et al.

(10) Patent No.: US 8,999,487 B2
(45) Date of Patent: Apr. 7, 2015

(54) SYSTEMS AND METHODS FOR PROTECTION OF COSMETIC SURFACES AND OVERFLOW PREVENTION ON ELECTRONIC DEVICES

(75) Inventors: Andrew M. Berg, Cupertino, CA (US); Michael B. Wittenberg, Sunnyvale, CA (US); Sawyer I. Cohen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 30 days.

(21) Appl. No.: 13/607,538

(22) Filed: Sep. 7, 2012

(65) Prior Publication Data

US 2014/0072759 A1    Mar. 13, 2014

(51) Int. Cl.
| | |
|---|---|
| *B32B 3/24* | (2006.01) |
| *H01L 21/64* | (2006.01) |
| *B32B 3/26* | (2006.01) |
| *C09J 7/02* | (2006.01) |
| *B32B 7/02* | (2006.01) |
| *H05K 5/02* | (2006.01) |

(52) U.S. Cl.
CPC ............. *H01L 21/64* (2013.01); *B32B 3/266* (2013.01); *C09J 7/0242* (2013.01); *B32B 7/02* (2013.01); *H05K 5/02* (2013.01); *Y10T 156/1039* (2015.01); *Y10T 428/2826* (2015.01); *Y10T 428/24322* (2015.01); *Y10T 156/108* (2015.01); *Y10T 156/10* (2015.01); *Y10T 428/24959* (2015.01); *Y10T 156/1062* (2015.01); *C09J 7/0203* (2013.01); *C09J 2201/128* (2013.01); *C09J 2203/326* (2013.01); *C09J 2461/00* (2013.01)

(58) Field of Classification Search
CPC ......................................................... B32B 3/30
USPC .......................................................... 428/138
See application file for complete search history.

(56) References Cited

U.S. PATENT DOCUMENTS

| | | | |
|---|---|---|---|
| 2007/0102192 A1* | 5/2007 | Naito et al. ................... | 174/389 |
| 2009/0008142 A1 | 1/2009 | Shimizu et al. | |
| 2011/0070448 A1 | 3/2011 | Matsumura et al. | |

FOREIGN PATENT DOCUMENTS

| | | |
|---|---|---|
| GB | 913547 | 12/1962 |
| GB | 1208737 | 10/1970 |
| JP | 2004072010 | 3/2004 |

* cited by examiner

*Primary Examiner* — William P Watkins, III
(74) *Attorney, Agent, or Firm* — Kendall P. Woodruff; Joseph F. Guihan

(57) ABSTRACT

Systems and methods for protection of cosmetic surfaces on electronic devices and adhesive overflow prevention are provided. In particular, an assembly for protecting a cosmetic surface can include a heat activated adhesive, such as a heat active film adhesive ("HAF"), which can be used to secure a mesh to the cosmetic surface. In some embodiments, a protective layer having a center layer laminated between two layers of heat activated adhesive can be used to protect the cosmetic surface from scratches caused by the mesh. In some embodiments, one or more hot shoes can be used to cross-link the heat activated adhesives to the mesh and the cosmetic surface. Because the shape of a shoe can influence the flow of heat activated adhesives during cross-linking, different shoes can be selected in order to minimize overflow in certain locations in the assembly.

18 Claims, 12 Drawing Sheets

SYSTEMS AND METHODS FOR PROTECTION OF COSMETIC SURFACES AND OVERFLOW PREVENTION ON ELECTRONIC DEVICES

FIELD OF THE INVENTION

This can relate to systems and methods for protection of cosmetic surfaces on electronic devices and, more particularly, to the protection of cosmetic surfaces during adhesive application.

BACKGROUND OF THE DISCLOSURE

Many electronic devices (e.g., media players and cellular telephones) often include one or more cosmetic surfaces. One example of a cosmetic surface is an area surrounding an acoustic opening, which can be made of glass. In some cases, a cosmetic mesh may be attached to the cosmetic surface. An adhesive, typically a pressure sensitive adhesive ("PSA"), may be used to attach the mesh to the cosmetic surface.

In particular, the PSA can be positioned in an indented location between the mesh and the cosmetic surface. Then, in order to activate the PSA, pressure can be applied to the PSA. Once the PSA sets after a period of time, the mesh can become attached to the cosmetic surface.

PSAs, however, are susceptible to the rotation and shift of the mesh after installation. Moreover, PSAs have relatively weak bonding strengths as compared to other adhesives.

SUMMARY OF THE DISCLOSURE

Systems and methods are disclosed for the protection of cosmetic surfaces on electronic devices and adhesive overflow prevention. As used herein, a "cosmetic surface" can refer to any surface of an electronic device that is prone to scratches such as, for example, an area surrounding an acoustic opening. In some cases, the cosmetic surface can be ink-covered glass.

A cosmetic surface assembly for protecting a cosmetic surface can include a heat activated adhesive, such as a heat active film adhesive ("HAF"), which can be used to secure a mesh to a cosmetic surface. In some embodiments, a protective layer having a center layer laminated between two layers of heat activated adhesive can be used to protect the cosmetic surface from scratches caused by the mesh. In particular, the protective layer can have a first side that secures the protective layer to the cosmetic surface. The protective layer can have a second side that secures the protective layer to the mesh.

In some embodiments, the protective layer can be made in laminated rolls before die-cutting. In these embodiments, a first cross-linking process can be used to secure the heat activated adhesives to the protective layer. At a later time, a second cross-linking process can be used to secure the protective layer to the mesh and the cosmetic surface.

In some embodiments, one or more hot shoes can be used to cross-link the heat activated adhesives to the mesh and the cosmetic surface. Because the shape of a shoe can influence the flow of heat activated adhesives during cross-linking, different shoes can be selected in order to minimize overflow in certain locations in the assembly.

In other embodiments, a layer of hard-coat can be used to prevent scratches from forming on the cosmetic surface. For example, the hard-coat can be added between the cosmetic surface (e.g., the ink on glass) and the heat activated adhesive.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION OF THE DISCLOSURE

Systems and methods for protection of cosmetics surfaces on electronic devices are provided and described with reference to FIGS. 1-8.

Figure 1:
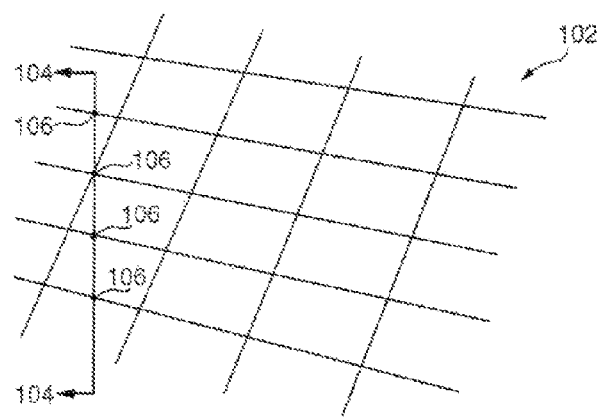
FIG. 1 is a perspective view of a mesh with pressure points.
Figure 2:
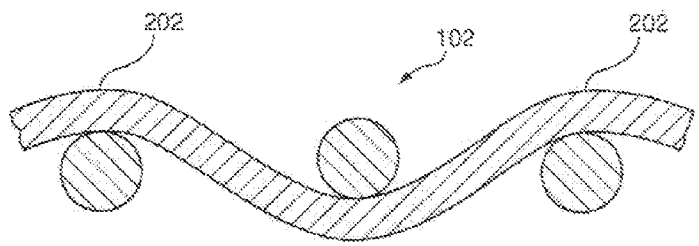
FIG. 2 is a cross-sectional view of the mesh of FIG. 1.

FIGS. 1 and 2 show perspective and cross-sectional views of a mesh 102, respectively. Mesh 102 can be attached to one or more cosmetic surfaces of an electronic device.

As used herein, "cosmetic surfaces" can include any surface of an electronic device that may be prone to scratches (e.g., glass) such as, for example, a region of glass near an acoustic opening on an electronic device. In some embodiments, the cosmetic surface can include ink on one or more sides (e.g., ink-covered glass).

Mesh 102 can be created from a woven metal weave (e.g., a weave of wires). The woven metal weave can be subjected through a calendaring process to produce a matte textured mesh. The textured mesh can then be rotated by 45 degrees and cut to size (e.g., along line 104 of FIG. 1). As shown in FIG. 1, the cutting of the mesh at a 45 degree angle can cause multiple sharp edges 106 to form on the mesh. As a result, when mesh 102 is later attached to a cosmetic surface, sharp edges 106 can scratch and damage the cosmetic surface. It is understood that mesh 102 can be made from non-metal materials such as, for example, aramid fibers.

In some embodiments, in order to prevent sharp edges 106 from scratching a cosmetic surface, mesh 102 can be subjected to a process to smooth these edges. For example, mesh 102 can be deburred such that sharp edges 106 can be turned away from the cosmetic surface. Persons skilled in the art will appreciate that any suitable process can be used to smooth sharp edges 106 including, for example, electro-polishing mesh 102, applying a physical vapor deposition ("PVD") coat to mesh 102, electro-plating mesh 102, and/or any combination thereof.

In addition to sharp edges 106, the shape of mesh 102 can also damage cosmetic surfaces. In particular, because mesh 102 is formed from interleaved wires, multiple pressure points 202 (FIG. 2) can exist on mesh 102. Thus, similar to sharp edges 106, pressure points 202 can also scratch a cosmetic surface when mesh 102 is attached.

In some embodiments, mesh 102 can be secured to a cosmetic surface using an adhesive. Conventionally, a pressure sensitive adhesive ("PSA") can be used as the adhesive. Unfortunately, PSAs are susceptible to the rotation and shift of mesh 102 after mesh 102 is attached to the cosmetic surface. Moreover, PSAs have relatively weak bonding strengths as compared to other adhesives.

Thus, instead of PSAs, a heat activated film adhesive ("HAF") can be used to secure mesh 102 to a cosmetic surface. HAF is a thermoset, which can be a heat-activated resin (e.g., phenolic resin) in its initial form. Following a cross-linking process, during which heat and pressure are jointly applied to the heat-activated resin, the HAF can be set to its final adhesive form.

In one embodiment, the HAF used to secure mesh 102 to the cosmetic surface can have a thickness of 0.08 mm. Persons skilled in the art will appreciate that this thickness is merely illustrative, and that any suitable thickness can be selected for the HAF.

Because setting a HAF requires the application of both heat and pressure, HAFs are more difficult to set as compared to PSAs, which require only pressure. In addition, HAF is a one-time heat set adhesive. In other words, once a HAF sets, the HAF can no longer be reflowed.

Despite these drawbacks, HAFs have multiple advantages over PSAs including: higher bonding strengths, better height control, and no possibility of mesh rotation or shift after installation. However, although HAF does not have a carrier, the use of a HAF as an adhesive can cause scratches on the cosmetic surface for other reasons. In particular, when attaching mesh 102 to ink-covered glass using a HAF, the HAF can soften when it is heated during the cross-linking process. This can cause mesh 102 to penetrate the HAF, which may then allow sharp edges 106 (FIG. 1) and/or pressure points 202 (FIG. 2) of mesh 102 to scratch the ink. Furthermore, during the cross-linking process, the HAF can flow into one or more through-holes in the glass and create visible overflow.

Accordingly, various approaches can be used to reduce these problems and allow HAFs to be used when applying mesh to ink-covered glass. In particular, in one embodiment, a protective layer can be laminated to the HAF. The protective layer can prevent the sharp edges and/or pressure points of the mesh from scratching the ink on the glass. In addition, the stiffness of the protective layer can prevent the HAF from shifting during application, which helps to reduce overflow.

Figure 3:
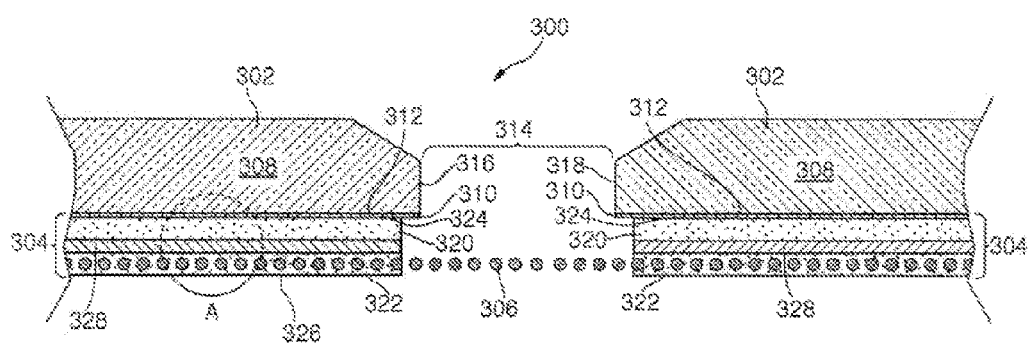
FIG. 3 is a cross-sectional view of a cosmetic surface assembly on an electronic device in accordance with some embodiments of the invention.

Turning now to FIG. 3, a cross-sectional view of cosmetic surface assembly 300 on an electronic device is shown. The electronic device can include any suitable electronic device having one or more cosmetic surfaces. The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof. In some embodiments, the electronic device may perform a single function (e.g., a device dedicated to playing music) and, in other embodiments, the electronic device may perform multiple functions (e.g., a device that plays music, displays video, stores pictures, and receives and transmits telephone calls).

Cosmetic surface assembly 300 can include cosmetic surface 302, adhesive layer 304, and mesh 306. Mesh 306 can be the same as or similar to mesh 102 of FIGS. 1 and 2. As discussed above, cosmetic surface 302 can be an area surrounding an acoustic opening on the electronic device such as ink-covered glass. For example, ink 310 can be applied to side 312 of glass 308. In addition, cosmetic surface 302 (and glass 308) can include through-hole 314, which can be surrounded by sides 316 and 318 of cosmetic surface 302. Mesh 306 can be secured to side 312 of cosmetic surface 302 to cover through-hole 314. Persons skilled in the art will appreciate that although cosmetic surface 302 is described as including glass 308, cosmetic surface 302 can be formed using any suitable material.

Adhesive layer 304 can include cross-linked heat activated adhesives 320 and 322 on sides 324 and 326, respectively. Cross-linked heat activated adhesives 320 and 322 can be HAFs. In particular, cross-linked heat activated adhesive 320 can secure adhesive layer 304 to side 312 of glass 308, and cross-linked heat activated adhesive 322 can secure adhesive layer 304 to mesh 306. Persons skilled in the art will appreciate that instead of HAFs, adhesives 320 and 322 can instead be made from another suitable adhesive material.

Adhesive layer 304 can include protective layer 328 between sides 324 and 326. Protective layer 328 can be a thin layer that is made from any material suitable for protecting cosmetic surface 302 from damage. For example, protective layer 328 can be made from a non-woven paper material that has a higher melting temperature than heat activated adhesives 320 and 322. This material can be selected to bond well with heat activated adhesives 320 and 322. In addition, because the material can be selected to have a higher melting temperature than heat activated adhesives 320 and 322, it will not melt or burn during the cross-linking process. This material, however, may disintegrate in wet processes (e.g., ultrasonic cleaning).

As another example, protective layer 328 can be made from a suitable plastic material such as polyethylene terephthalate ("PET"), polyimide ("PI"), and/or another plastic material that adheres well to heat activated adhesives 320 and 322 and is robust to moisture.

As yet another example, protective layer 328 can be made from a fabric of glass and/or natural fibers. As a further example, protective layer 328 can be made from a metal foil.

In some embodiments, protective layer 328 (e.g., metal foil) may be perforated (e.g., microperforated) in order to allow heat activated adhesives 320 and 322 to bond directly to each other. For example, the microperforation can be performed using die-cutting, laser cutting, chemical etching, any other suitable process, and/or any combination thereof.

In some embodiments, protective layer 328 can be a suitable porous material. This can improve both the cross-linkage of heat activated adhesives 320 and 322 to protective layer 328 and the cross-linkage of heat activated adhesives 320 and 322 to one another (e.g., "through-pore" HAF cross-linkage in which heat activated adhesive 320 is bonded to heat activated adhesive 322). In some cases, adhesive layer 304 can have a footprint that compensates for flow during cross-linkage.

Figure 4:
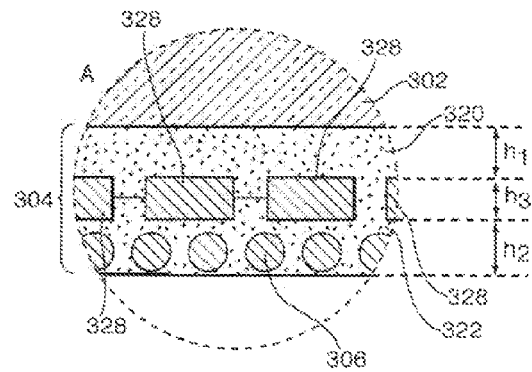
FIG. 4 is a close-up of portion A of the cross-sectional view of FIG. 3 in accordance with some embodiments of the invention.

Referring now to FIG. 4, a close-up of portion A of the cross-sectional view of assembly 300 is shown. In one embodiment, heat activated adhesive 320 can have a thickness $h_1$ of 0.03 mm, protective layer 328 can have a thickness $h_2$ of 0.02 mm, and heat activated adhesive 322 can have a thickness $h_3$ of 0.03 mm. Persons skilled in the art will appreciate that these thicknesses are merely illustrative, and that the various layers of assembly 300 can have any suitable thicknesses.

Figure 5A:
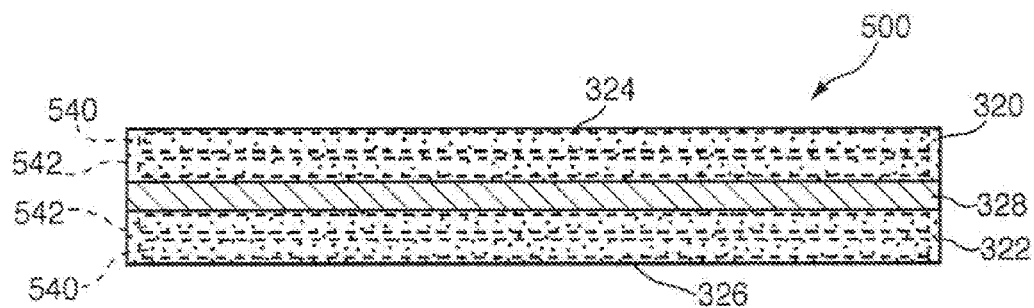
FIG. 5A is a cross-sectional view of the assembly of FIG. 3, after a first step in a creation process, in accordance with some embodiments of the invention.

FIGS. 5A-5E are cross-sectional views illustrating a number of steps for forming assembly 300 of FIG. 3. FIG. 5A shows laminated roll of adhesive 500 with protective layer having sides 324 and 326. Laminated roll 500 can be generated after a first step in which protective layer 328 can be laminated between heat activated adhesive 320 on side 324 and heat activated adhesive 322 on side 326. In some embodiments, the lamination of protective layer 328 to heat activated adhesives 320 and 322 can be performed prior to die-cutting.

As shown in FIG. 5A, the adhesive thickness and material are shown as being the same on sides 324 and 326. However, persons skilled in the art will appreciate that the adhesive thickness and/or material may be different on each side for optimum properties. For example, the adhesive thickness may be increased on the side that will be applied to mesh (e.g., side 326) because it can be more difficult to bond to the mesh than to a cosmetic surface (e.g., glass).

During lamination, heat-activated adhesives 320 and 322 can be heated below cross-linking material (e.g., cross-linked portions 402) to semi-attach adhesives 320 and 322 to protective layer 328. These large laminated rolls can thus serve as a replacement product for standard HAF. The lamination can occur using one or more processes such as, for example, a heated flat-bed process, a continuous reel process between heated rollers, an application of hot air, any other suitable process(es), and/or any combination thereof. Moreover, if protective layer 328 is made from a suitable material (e.g., stainless steel foil), induction heating may also be used to laminate roll 500.

The result of this lamination can be a partially cross-linked adhesive layer. In addition, heat activated adhesives 320 and 322 can each include cross-linked portions 540 and cross-linkable portions 542. Cross-linked portions 540 can be used to secure the adhesive to the partially cross-linked adhesive layer, and cross-linkable portions 542 can be available to be cross-linked at a later time. For example, cross-linkable portions 542 can be cross-linked with a cosmetic surface and/or a mesh during subsequent processing.

In some cases, the cross-linkage of cross-linked portions 540 can generate water, which is an undesirable byproduct. In particular, since the area of roll 500 is relatively large, the amount of water that is generated can be substantial, which can leave bubbles within the roll. Bubbles are undesirable because they can affect the flatness of roll 500 and can introduce inconsistencies in the roll. Consequently, by running laminated roll 500 through a calendar machine, bubbles can be removed (e.g., squeezed or burned off) from the roll.

Figure 5B:
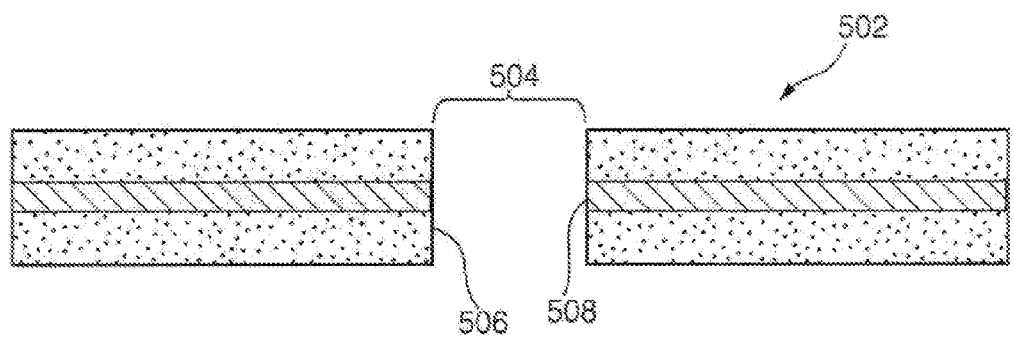
FIG. 5B is a cross-sectional view of the assembly of FIG. 5A, after a second step in the creation process, in accordance with some embodiments of the invention.

FIG. 5B shows a second step in which laminated roll 500 of FIG. 5A can be die-cut, which forms die-cut adhesive 502. Moreover, the die-cut can create cutout 504 in adhesive layer 502. Sides 506 and 508 of die-cut adhesive 502 can surround cutout 504.

Figure 5C:
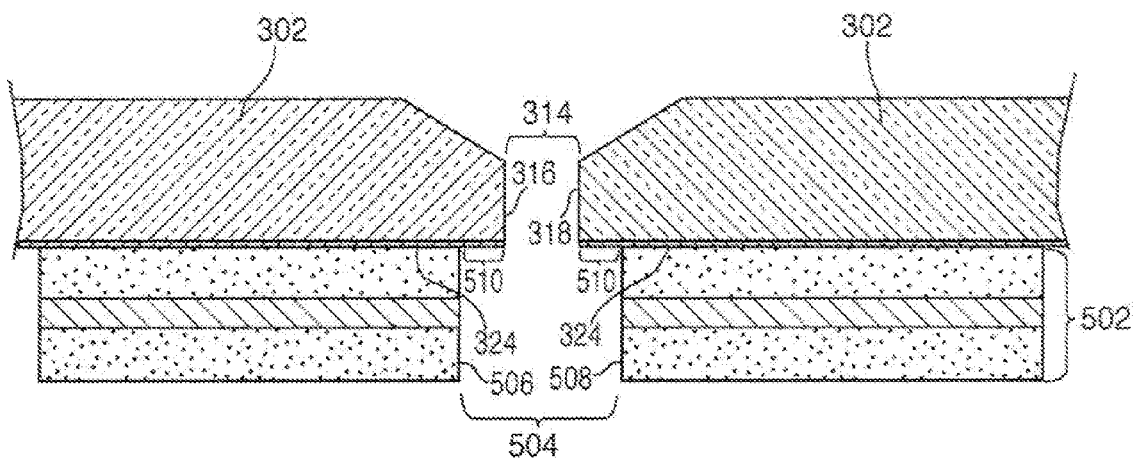
FIG. 5C is a cross-sectional view of the assembly of FIGS. 5A and 5B, after a third step in the creation process, in accordance with some embodiments of the invention.

FIG. 5C shows a third step in which side 324 of die-cut adhesive 502 can be applied to cosmetic surface 302. In some embodiments, cosmetic surface 302 may be heated prior to applying side 324 of die-cut adhesive 502.

During this application, cutout 504 can be positioned to align with through-hole 314 of cosmetic surface 302. In addition, as shown in FIG. 5C, side 506 of adhesive 502 can be offset from side 316 of through-hole 314 by pre-determined distance 510. Similarly, side 508 of adhesive 502 can be offset from side 318 of through-hole 314 by pre-determined distance 510. This offset placement of adhesive 502 with respect to the sides of through-hole 314 can help reduce leakage during the subsequent cross-linking process.

Figure 5D:
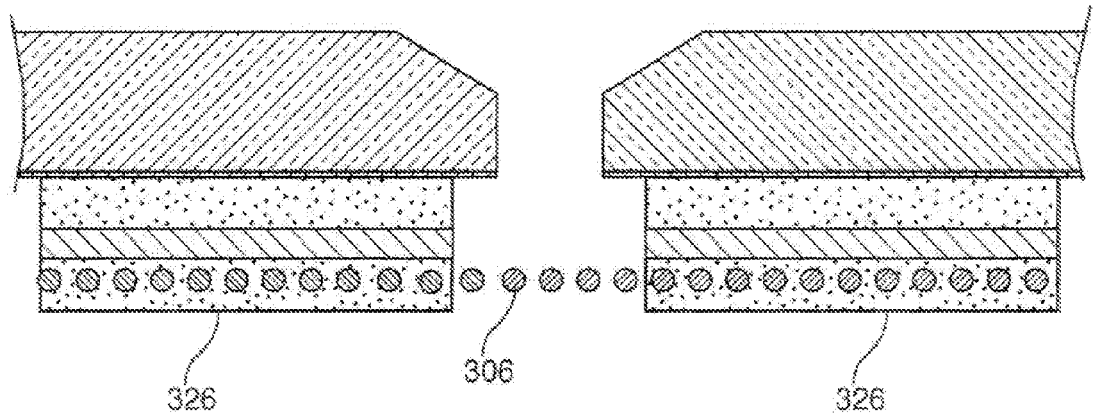
FIG. 5D is a cross-sectional view of the assembly of FIG. 5A-5C, after a fourth step in the creation process, in accordance with some embodiments of the invention.

FIG. 5D shows a fourth step in which side 326 of die-cut adhesive 502 can be applied to mesh 306.

Figure 5E:
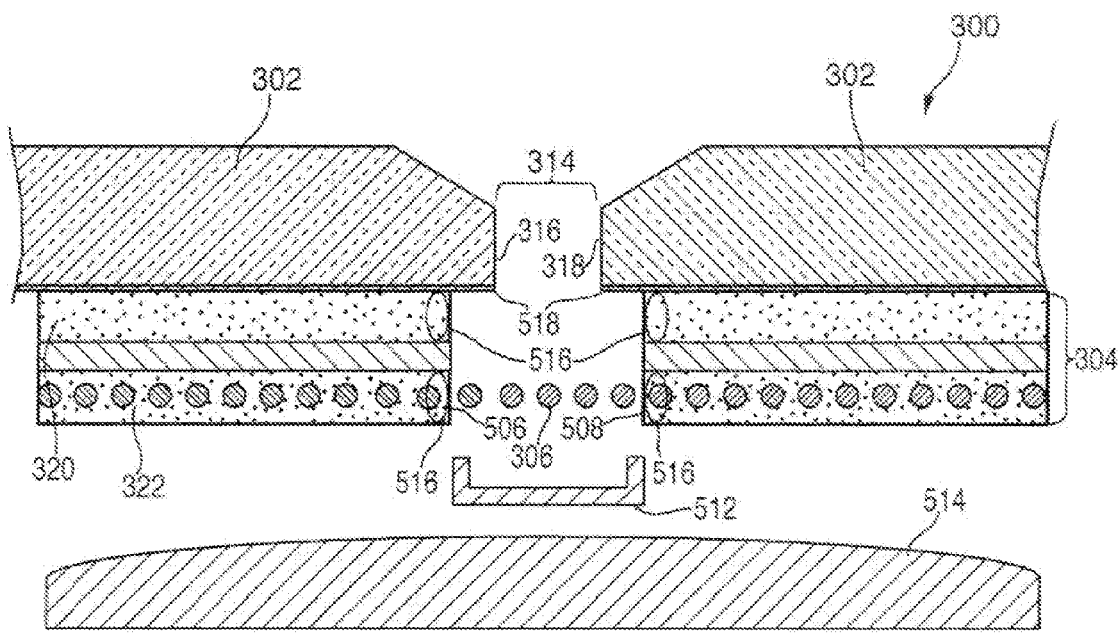
FIG. 5E is a cross-sectional view of the assembly of FIG. 5A-5D, after a fifth step in the creation process, in accordance with some embodiments of the invention.

FIG. 5E shows a fifth step in which heat activated adhesive 320 can be cross-linked to secure cosmetic surface 302, and heat activated adhesive 322 can be cross-linked to secure mesh 306. As a result of the cross-linking process, die-cut adhesive 502 can be transformed to adhesive layer 304 (FIGS. 3 and 4).

In some embodiments, one or more hot shoes (e.g., hot shoes 512 and 514) can be used for cross-linking. In particular, the hot shoe(s) can apply the heat and pressure to assembly 300 that is necessary for cross-linking. In some cases, the one or more hot shoes can be coated with a material that promotes ease of shoe removal from mesh 306 once the cross-linking process is complete. For example, the one or more hot shoes can be Teflon and/or silicone coated.

Hot shoe(s) can have any suitable shape such as, for example, a dish-shape, a dome-shape, a moat-shape, a u-shape, a semi-circular-shape, and/or any combination thereof. The shape of the hot shoe(s) can influence the flow of heat activated adhesives 320 and 322 during cross-linking. For example, a dish-shaped shoe can force the flow away from cosmetic surface 302.

During cross-linking, it is desirable to minimize overflow in certain locations (e.g., sides 316 and 318 of through-hole 314). Consequently, different types of hot shoe(s) can be used to direct the flow of heat activated adhesives 320 and 322. In one embodiment, for example, shoe 512 can be applied first. Shoe 512 can be a u-shaped shoe that provides a precise application of heat and pressure. Thus, the application of shoe 512 to cross-link first portion 516 of heat activated adhesive 320 can create dams 518 at sides 316 and 318 of through-hole 314. In other embodiments, instead of using shoe 512 to create dams 518, ink dams can be pre-formed on cosmetic surface 302.

After applying shoe 512, shoe 514 can be used to apply heat and pressure to cross-link the remaining portions of heat activated adhesives 320 and 322. In some cases, shoe 514 can be dome-shaped. The dome-shaped shoe can help to prevent leakage of heat activated adhesives 320 and 322 beyond sides 506 and 508 of adhesive layer 304. Additionally, dams 518 (e.g., pre-formed on cosmetic surface 302 or created by shoe 512), can prevent heat activated adhesives 320 and 322 from leaking into through-hole 314.

Figure 6A:
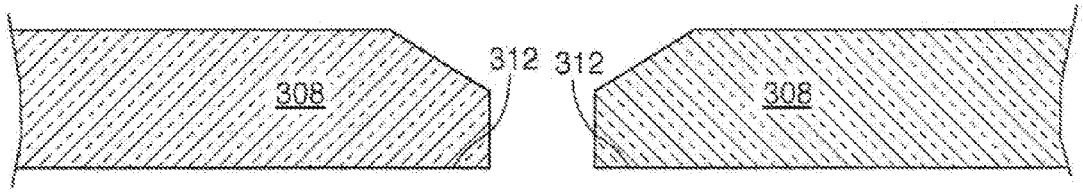
FIG. 6A is a cross-sectional view of another cosmetic surface assembly on an electronic device, after a first step in a creation process, in accordance with some embodiments of the invention.

FIGS. 6A-6E are cross-sectional views illustrating a number of steps for forming another assembly for protecting a cosmetic surface. FIG. 6A shows glass 308 having side 312.

Figure 6B:
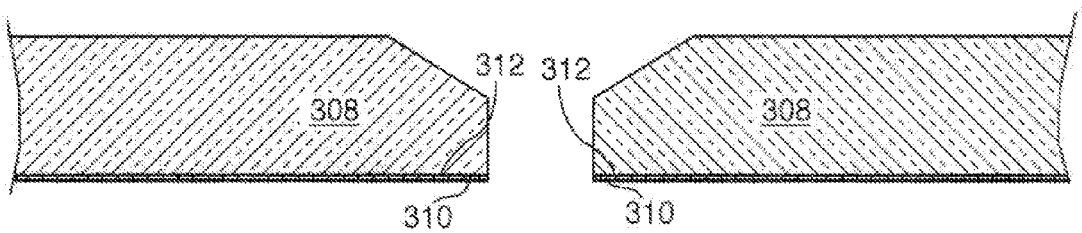
FIG. 6B is a cross-sectional view of the assembly of FIG. 6A, after a second step in the creation process, in accordance with some embodiments of the invention.

FIG. 6B shows a second step in which ink 310 can be applied to side 312 of glass 308. Persons skilled in the art will appreciate that ink 310 can be applied to glass 308 using any suitable technique. In one example, ink 310 can be screen-printed over side 312 of glass 308.

Figure 6C:
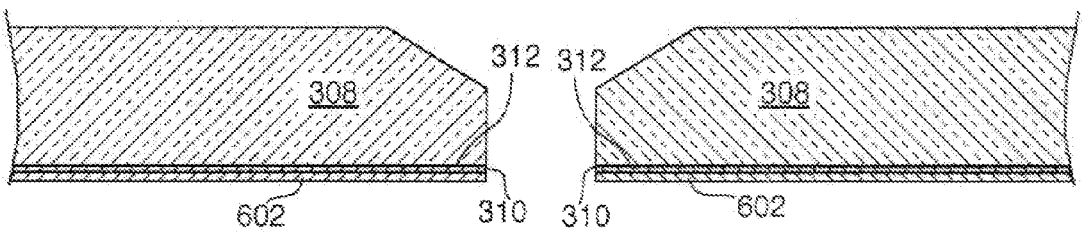
FIG. 6C is a cross-sectional view of the assembly of FIGS. 6A and 6B, after a third step in the creation process, in accordance with some embodiments of the invention.

FIG. 6C shows a third step in which a layer of hard-coat 602 can be applied to side 312 of glass 308 over ink 310. In some embodiments, hard-coat 602 can be screen printed over ink 310. Persons skilled in the art will appreciate that hard-coat 602 can be applied in any suitable manner (e.g., in a manner that is similar to the way in which ink 310 is applied to glass 308).

Figure 6D:
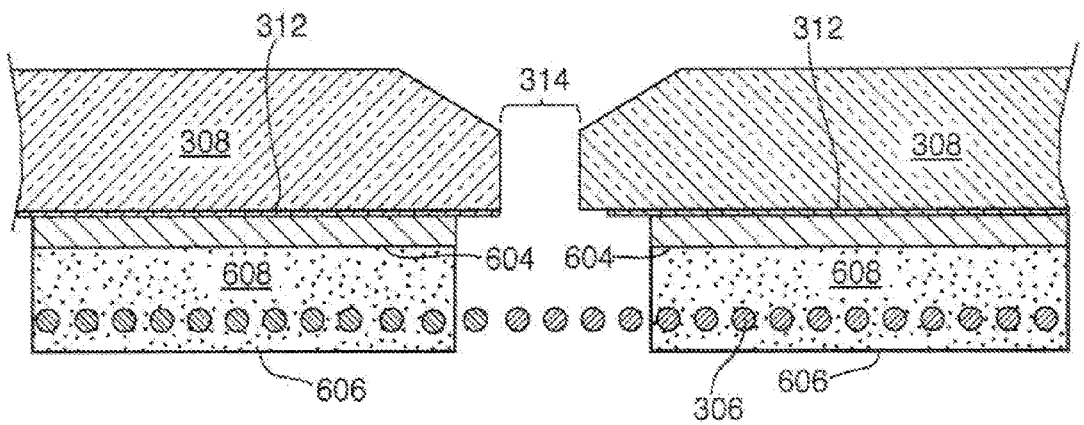
FIG. 6D is a cross-sectional view of the assembly of FIG. 6A-6C, after a fourth step in the creation process, in accordance with some embodiments of the invention.

FIG. 6D shows a fourth step in which side 604 of heat activated adhesive 608 is applied to side 312 of glass 308 and side 606 of heat activated adhesive 608 is applied to mesh 306. As a result, mesh 306 can cover through-hole 314 of glass 308.

Figure 6E:
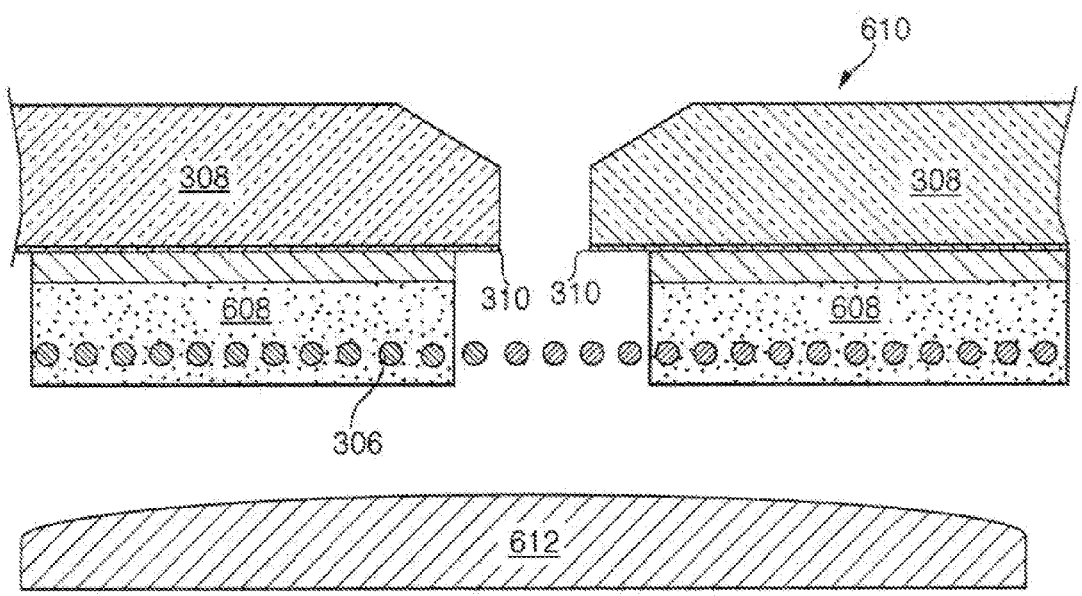
FIG. 6E is a cross-sectional view of the assembly of FIG. 6A-6D, after a fifth step in the creation process, in accordance with some embodiments of the invention.

FIG. 6E shows a fifth step in which assembly 610 is created by cross-linking heat activated adhesive 608 to secure glass 308 and mesh 306. In some embodiments, hot shoe 612 can be used for the cross-linking. Because of the placement of hard-coat 602 between heat activated adhesive 608 and the ink-covered glass, hard-coat 602 can prevent heat activated adhesive 608 from scratching ink 310.

Although not shown, persons skilled in the art will appreciate that a hybrid assembly can be used for protecting cosmetic surfaces, where the hybrid assembly can include both a hard coat layer and a center layer between heat activated adhesives.

Turning now to FIGS. 7A-9, various methods for cross-linking of heat activated adhesives and preventing adhesive overflow are shown. For the sake of simplicity, mesh 306 is shown as a light gray layer in FIGS. 7A-9.

Figure 7A:
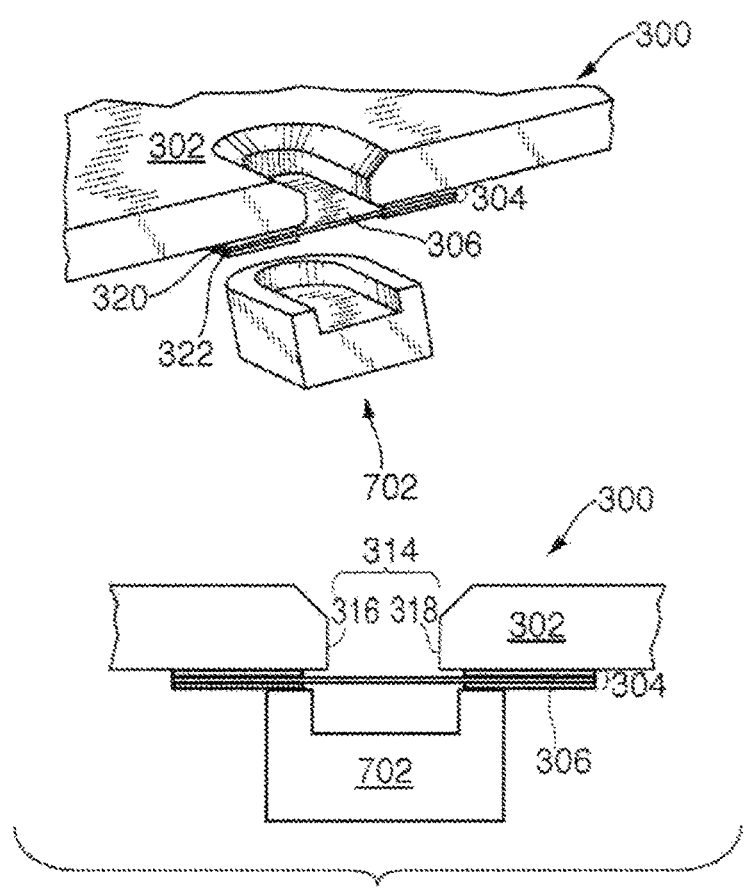
FIGS. 7A-7C are perspective views of the successive application of different hot shoes to a cosmetic surface assembly in accordance with some embodiments of the invention.
Figure 7B:
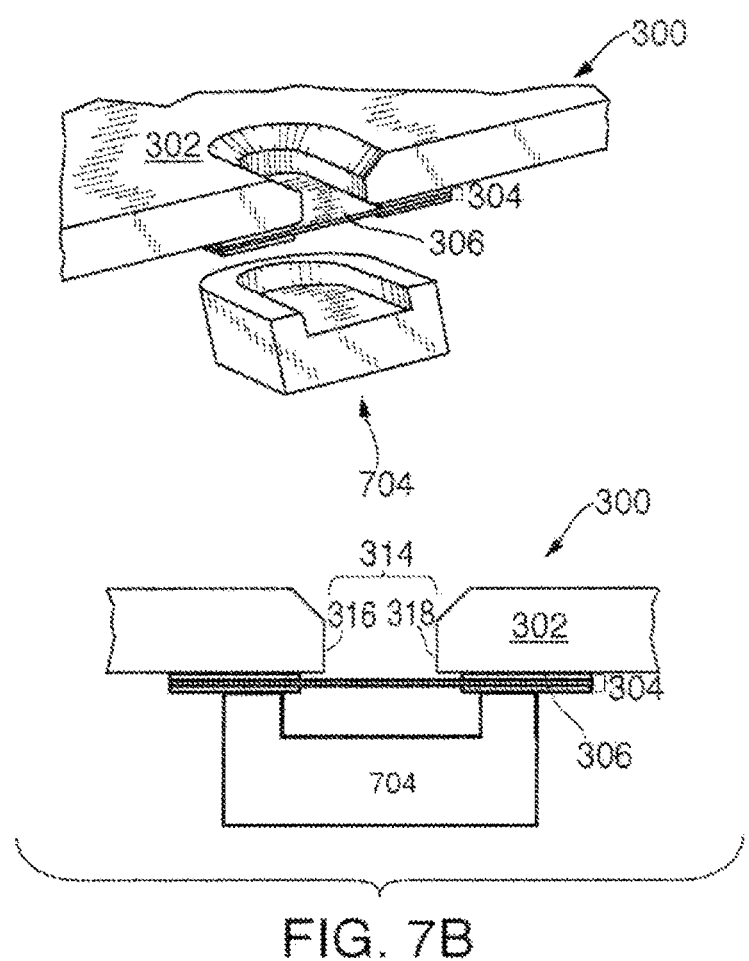
Figure 7C:
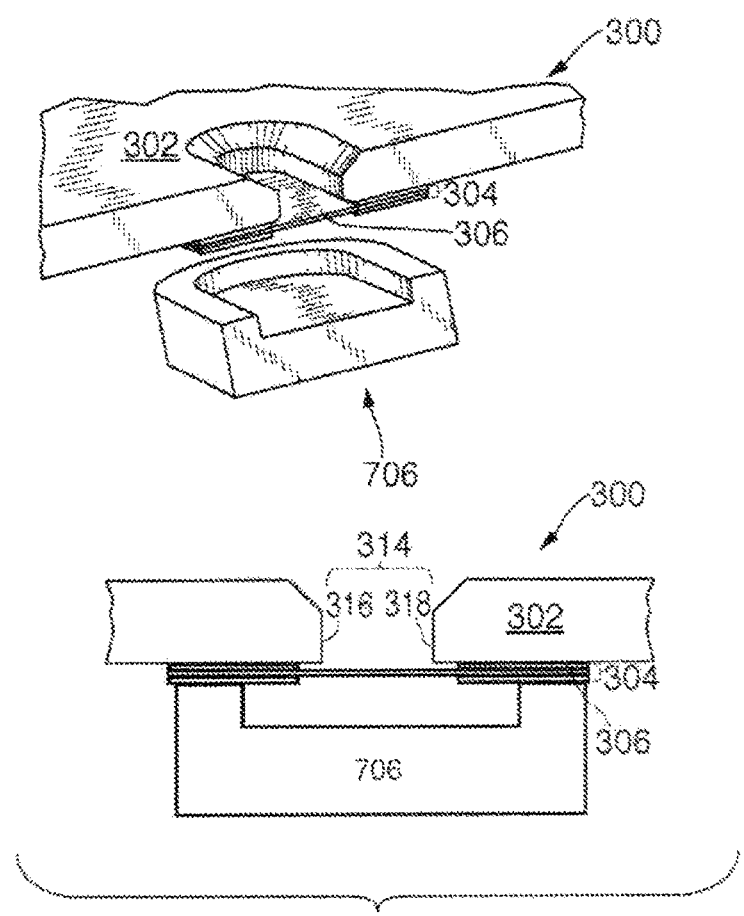

FIGS. 7A-7C are perspective views of the successive application of different hot shoes to a cosmetic surface assembly in accordance with some embodiments of the invention. Hot shoes 702-706 can be used to progressively cross-link heat activated adhesives 320 and 322. That is, hot shoe 702 can be applied to adhesive layer 304 first, followed by hot shoe 704 and then hot shoe 706. Each hot shoe 702-706 can have increasingly wider-spaced arms, which can allow different portions of heat activated adhesives 320 and 322 to be cross-linked. The direction of force applied by each hot shoe is indicated by the corresponding arrows in FIGS. 7A-7C.

Significantly, each of hot shoes 702-706 can only be applied to portions of cosmetic surface assembly 300 that are outward from the perimeter of through-hole 314 (e.g., areas that border sides 316 and 318 of through-hole 314). This can help to ensure that heat activated adhesives 320 and 322 do not overflow into through-hole 314.

Figure 8:
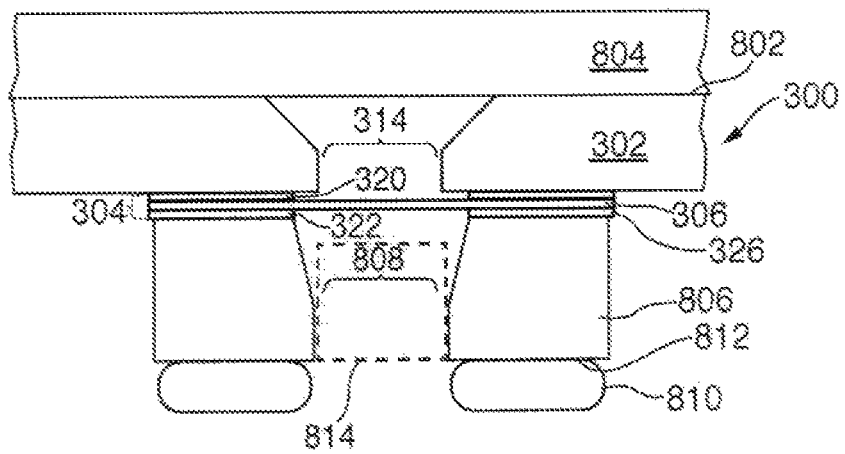
FIG. 8 is a cross-sectional view of one approach for applying pressure to a cosmetic surface assembly in accordance with some embodiments of the invention.

FIG. 8 is a cross-sectional view of one approach for applying pressure to a cosmetic surface assembly. Side 802 of cosmetic surface 302 can be applied to fixture 804. Hot shoe 806 having through-hole 808 can be applied to side 326 of adhesive layer 304. Moreover, hot shoe 806 can be applied in such a manner that through-hole 808 of hot shoe 806 can line up with through-hole 314 of cosmetic surface 302. Seal 810, which can be a silicone seal, can be coated on side 812 of hot shoe 806.

To cross-link heat activated adhesives 320 and 322, hot shoe 806 can apply a force to assembly 300 in the direction indicated by the arrows in FIG. 8. In addition, while hot shoe 806 is being applied to assembly 300, a positive pressure can be applied to the center of mesh 306. In particular, seal 810 can be used to seal hot shoe 806 to the rest of fixture 804 (not shown in FIG. 8) such that chamber 814 can become pressurized. Because chamber 814 is pressurized higher than the surrounding air, overflow from heat activated adhesives 320 and 322 can be directed away from chamber 814.

Figure 9:
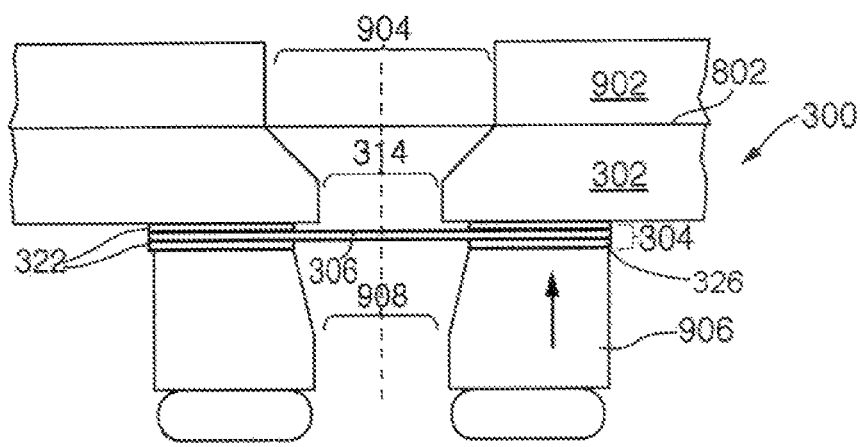
FIG. 9 is a cross-sectional view of another approach for applying pressure to a cosmetic surface assembly in accordance with some embodiments of the invention.

FIG. 9 is a cross-sectional view of another approach for applying pressure to a cosmetic surface assembly in accordance with some embodiments of the invention. In particular, side 802 of cosmetic surface 302 can be applied to fixture 902. Fixture 902 can have an opening 904. Thus, in some embodiments, opening 904 of fixture 902 can be positioned to line up with through-hole 314 of cosmetic surface 302.

Hot shoe 906 having through-hole 908 can be applied to side 326 of adhesive layer 304. Moreover, hot shoe 906 can be applied in such a manner that through-hole 908 can line up with through-hole 314 of cosmetic surface 302.

To cross-link heat activated adhesives 320 and 322, hot shoe 908 can apply a force to assembly 300 in the direction indicated by the arrows in FIG. 9. In addition, while hot shoe 906 is being applied to assembly 300, the portion of mesh 306 covering the center of through-hole 314 can be cooled. For example, a high velocity air jet applied in a direction indicated by the dashed line can be used to cool the air surrounding this portion of mesh 306. This can help to reduce adhesive overflow during the cross-linking process.

Figure 10:
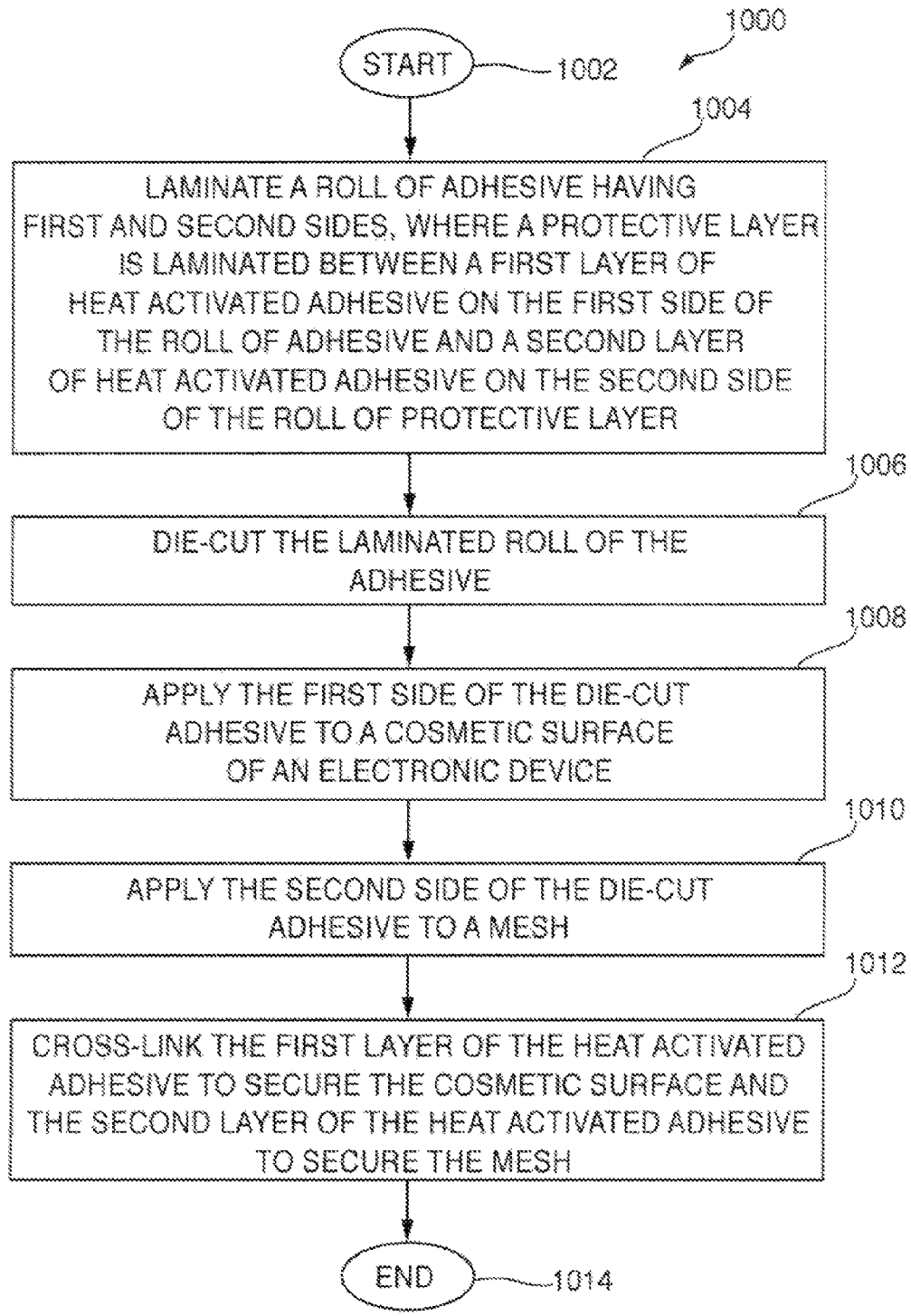
FIG. 10 is a flowchart of an illustrative manufacturing process for creating an assembly for protecting cosmetic surfaces in accordance with some embodiments of the invention.

FIG. 10 is a flowchart of an illustrative manufacturing process 1000 for creating an assembly for protecting cosmetic surfaces. Process 1000 may start at step 1002, and, at step 1004, a roll of adhesive having first and second sides (e.g., sides 324 and 326 of FIG. 5A) can be laminated. In particular, a protective layer (e.g., protective layer 328 of FIG. 5A) can be laminated between a first layer of heat activated adhesive (e.g., heat activated adhesive 320 of FIG. 5A) on the first side of the roll and a second layer of heat activated adhesive (e.g., heat activated adhesive 322 of FIG. 5A) on the second side of the roll.

At step 1006, the laminated roll (e.g., laminated roll 500 of FIG. 5A) of the adhesive can be die-cut. For example, as shown in FIG. 5B, laminated roll 500 of FIG. 5A can be die-cut to form die-cut adhesive 502.

At step 1008, the first side of the die-cut adhesive can be applied to a cosmetic surface (e.g., cosmetic surface 302 of FIG. 5C) of an electronic device. Then, at step 1010, the second side of the die-cut adhesive can be applied to a mesh (e.g., mesh 306 of FIG. 5D).

Continuing to step 1012, the first layer of the heat activated adhesive can be cross-linked to secure the cosmetic surface, and the second layer of the heat activated adhesive can be cross-linked to secure the mesh. In some embodiments, as shown in FIGS. 5E and 7A-7C, one or more hot shoes (e.g., hot shoes 512 and 514) can be used in the cross-linking process. Process 1000 may then end at step 1014.

Figure 11:
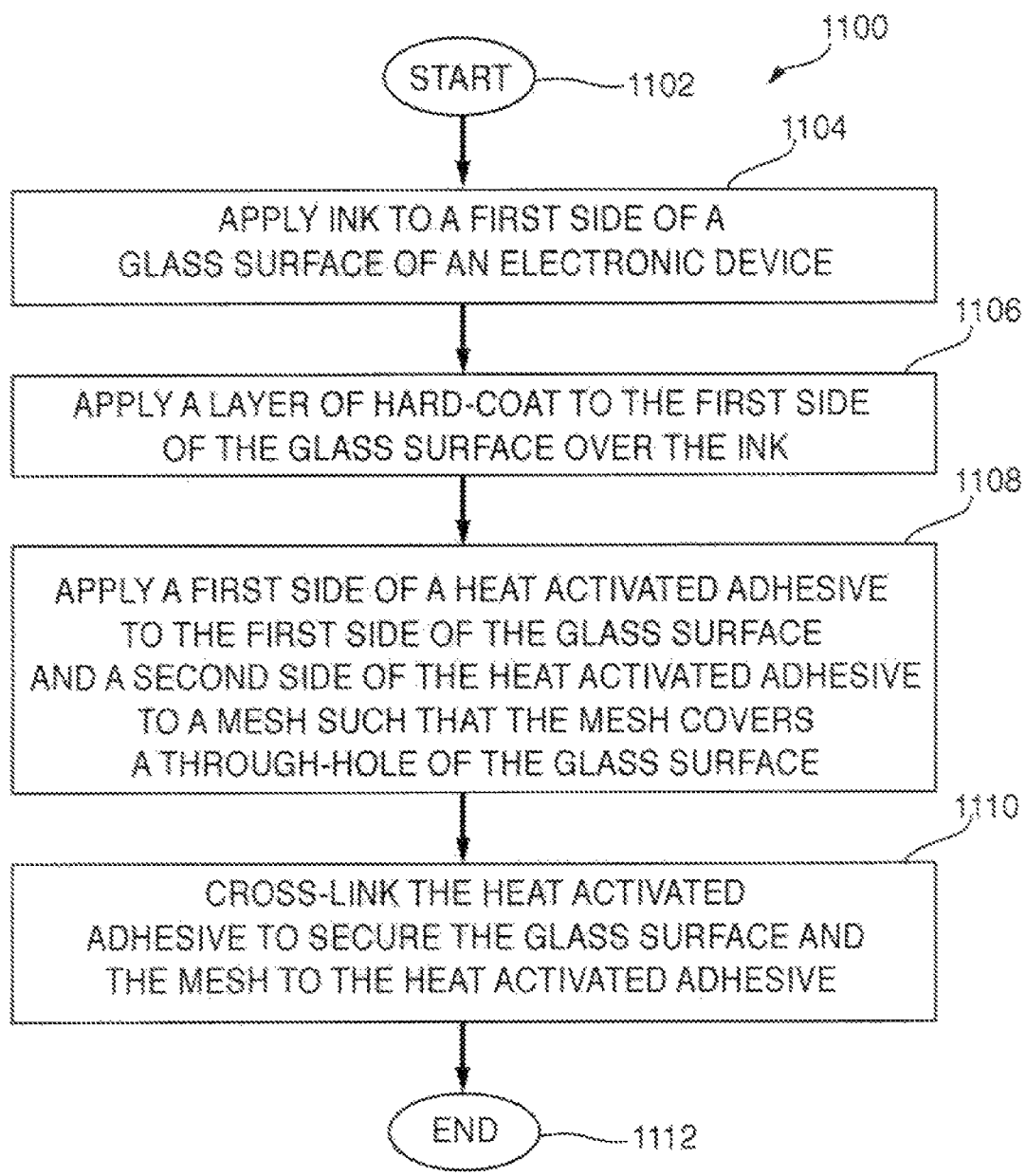
FIG. 11 is a flowchart of another illustrative manufacturing process for creating an assembly for protecting cosmetic surfaces in accordance with some embodiments of the invention.

FIG. 11 is a flowchart of another illustrative manufacturing process 1100 for creating an assembly for protecting cosmetic surfaces. Process 1100 may start at step 1102, and, at step 1104, ink (e.g., ink 310 of FIG. 6B) can be applied to a first side (e.g., side 312 of FIG. 6B) of a glass surface (e.g., glass 308 of FIG. 6B) of an electronic device.

At step 1106, a layer of hard-coat (e.g., hard-coat 602 of FIG. 6C) can be applied to the first side of the glass surface over the ink. Then, at step 1108, a first side (e.g., side 604 of FIG. 6D) of a heat activated adhesive (e.g., heat activated adhesive 608 of FIG. 6D) can be applied to the first side of the glass surface, and a second side (e.g., side 606 of FIG. 6D) of the heat activated adhesive can be applied to a mesh (e.g., mesh 306 of FIG. 6D) such that the mesh covers a through-hole (e.g., through-hole 314 of FIG. 6D) of the glass surface.

At step 1110, the heat activated adhesive can be cross-linked to secure the glass surface and the mesh to the heat activated adhesive. For example, as shown in FIG. 6E, one or more hot shoes (e.g., hot shoe 612) can be used in the cross-linking process. Process 1100 may then end at step 1112.

While there have been described assemblies for the protection of cosmetic surfaces, it is to be understood that many changes may be made therein without departing from the spirit and scope of the invention. It is also to be understood that processes 700 and 800 of FIGS. 7 and 8 are merely illustrative. Any of the steps may be removed, modified, or combined, and any additional steps may be added, without departing from the scope of the invention.

The described embodiments of the invention are presented for the purpose of illustration and not of limitation.

What is claimed is:

1. An electronic device, comprising:
   glass with ink on a first side of the glass, the glass comprising a through-hole;
   an adhesive layer having first and second sides, a protective layer between the first and second sides, and a cutout aligned with the through-hole; and
   a mesh secured to the first side of the glass to cover the through-hole, wherein the first and second sides of the adhesive layer comprise cross-linked heat activated adhesive that, on the first side, secures the adhesive layer to the first side of the glass, and on the second side, secures the adhesive layer to the mesh.

2. The electronic device of claim 1, wherein the cross-linked heat activated adhesive is a heat active film adhesive ("HAF").

3. The electronic device of claim 1, wherein the protective layer comprises a porous material.

4. The electronic device of claim 1, wherein the protective layer comprises at least one of a non-woven paper material having a higher melting temperature than the cross-linked heat activated adhesive, a plastic material, a fabric of glass, a fabric of natural fibers, and a metal foil.

5. The electronic device of claim 4, wherein the plastic material comprises at least one of a polyethylene terephthalate ("PET") and polyimide ("PI").

6. The electronic device of claim 4, wherein the metal foil is micro-perforated.

7. The electronic device of claim 6, wherein the metal foil is micro-perforated using at least one of die-cutting, laser cutting, and chemical etching.

8. The electronic device of claim 1, wherein the mesh is a woven metal weave comprising a plurality of sharp edges, and wherein the protective layer prevents the plurality of sharp edges of the mesh from scratching the ink on the glass.

9. The electronic device of claim 1, wherein the mesh is a matte textured mesh.

10. An electronic device, comprising:
    a glass layer having at least one opening;
    a mesh attached to an interior surface of the glass layer, wherein the mesh covers the at least one opening in the glass layer; and
    a heat activated thermoset adhesive interposed between the glass layer and the mesh that attaches the mesh to the interior surface, wherein the heat activated thermoset adhesive has a hole that that aligns with the at least one opening.

11. The electronic device defined in claim 10 wherein the heat activated thermoset adhesive comprises first and second layers of heat activated thermoset film and a protective layer interposed between the first and second layers of heat activated thermoset film.

12. The electronic device defined in claim 11 wherein the protective layer comprises plastic.

13. The electronic device defined in claim 11 wherein the protective layer comprises metal foil.

14. The electronic device defined in claim 11 wherein the protective layer comprises perforations and wherein the first and second layers of heat activated thermoset film are in contact with each other through the perforations.

15. The electronic device defined in claim 11 further comprising a layer of ink formed on the interior surface of the glass layer, wherein the protective layer prevents the mesh from contacting the layer of ink.

16. The electronic device defined in claim 11 wherein the first layer of heat activated thermoset film is attached to the interior surface of the glass layer, wherein the second layer of heat activated film is attached to the mesh, and wherein the second layer of heat activated thermoset film is thicker than the first layer of heat activated thermoset film.

17. The electronic device defined in claim 10 further comprising:
    a layer of ink formed on the interior surface of the glass layer; and
    a layer of hard-coat formed over the layer of ink, wherein the layer of hard-coat forms a barrier between the heat activated thermoset adhesive and the layer of ink.

18. The electronic device defined in claim 10 wherein the at least one opening forms an acoustic opening.

* * * * *